(12) United States Patent
Cho et al.

(10) Patent No.: US 9,773,869 B2
(45) Date of Patent: Sep. 26, 2017

(54) SEMICONDUCTOR DEVICE AND METHOD OF FABRICATING THE SAME

(71) Applicant: SAMSUNG ELECTRONICS CO., LTD., Gyeonggi-do (KR)

(72) Inventors: Yong-Min Cho, Gyeonggi-do (KR); Hyun-Jae Kang, Gyeonggi-do (KR); Dong-Il Bae, Incheon (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 125 days.

(21) Appl. No.: 14/206,373

(22) Filed: Mar. 12, 2014

(65) Prior Publication Data

US 2015/0263172 A1 Sep. 17, 2015

(51) Int. Cl.
| | |
|---|---|
| H01L 29/78 | (2006.01) |
| H01L 29/08 | (2006.01) |
| H01L 29/66 | (2006.01) |
| H01L 29/165 | (2006.01) |

(52) U.S. Cl.
CPC .... *H01L 29/0847* (2013.01); *H01L 29/66545* (2013.01); *H01L 29/66795* (2013.01); *H01L 29/785* (2013.01); *H01L 29/165* (2013.01); *H01L 29/7848* (2013.01)

(58) Field of Classification Search
CPC .................................................. H01L 29/7854
See application file for complete search history.

(56) References Cited

U.S. PATENT DOCUMENTS

| | | | |
|---|---|---|---|
| 6,566,734 B2 | 5/2003 | Sugihara et al. | |
| 6,764,884 B1 | 7/2004 | Yu et al. | |
| 6,943,087 B1 | 9/2005 | Xiang et al. | |
| 7,553,717 B2 | 6/2009 | Chakravarthi et al. | |
| 7,682,887 B2 | 3/2010 | Dokumaci et al. | |
| 7,964,487 B2 | 6/2011 | Cheng et al. | |
| 8,361,850 B2 | 1/2013 | Tateshita | |
| 8,368,149 B2 | 2/2013 | Lander | |
| 8,384,142 B2 | 2/2013 | Juengling | |
| 8,633,545 B2* | 1/2014 | Lee | 257/368 |
| 2011/0079829 A1* | 4/2011 | Lai | H01L 29/41791 257/288 |
| 2011/0237046 A1 | 9/2011 | Maszara et al. | |

(Continued)

FOREIGN PATENT DOCUMENTS

| | | |
|---|---|---|
| KR | 1020110049090 | 5/2011 |
| KR | 1020110114857 | 10/2011 |

OTHER PUBLICATIONS

Kawasaki et al. ("Challenges and Solutions of FinFET Integration in an SRAM Cell and a Logic Circuit for 22 nm node and beyond." IBM Res. at Albany Nanotech, Toshiba America Electron. Components Inc., Albany NY, USA. Electronic Devices Meeting (IEDM), 2009 IEEE International, Dec. 2009, pp. 1-4).*

*Primary Examiner* — Stephen Bradley
(74) *Attorney, Agent, or Firm* — F. Chau & Associates, LLC

(57) ABSTRACT

A semiconductor device is provided. A substrate includes a fin. The fin extends in a first direction. A gate structure is disposed on a first region of the fin. The gate structure extends in a second direction crossing the first direction. A source/drain is disposed on a second region of the fin. The first source/drain is disposed on at least one sidewall of the gate structure. A top surface of the first region is lower than a top surface of the second region.

8 Claims, 20 Drawing Sheets

(56) References Cited

U.S. PATENT DOCUMENTS

| | | | |
|---|---|---|---|
| 2012/0088343 A1* | 4/2012 | Son | B82Y 10/00 438/239 |
| 2012/0161238 A1 | 6/2012 | Scheiper et al. | |
| 2012/0211808 A1 | 8/2012 | Wei et al. | |
| 2012/0217577 A1 | 8/2012 | Hashimoto et al. | |
| 2012/0273895 A1* | 11/2012 | Anderson et al. | 257/369 |
| 2013/0001706 A1* | 1/2013 | Haran | H01L 29/66545 257/410 |
| 2013/0049103 A1 | 2/2013 | Schloesser et al. | |
| 2013/0049121 A1 | 2/2013 | Baldauf et al. | |
| 2013/0056795 A1 | 3/2013 | Wu et al. | |
| 2013/0056826 A1 | 3/2013 | Liu et al. | |
| 2013/0092992 A1 | 4/2013 | Chang et al. | |
| 2013/0214358 A1* | 8/2013 | Jagannathan | H01L 29/4908 257/347 |
| 2014/0308808 A1* | 10/2014 | Cheng | H01L 29/66545 438/595 |

\* cited by examiner

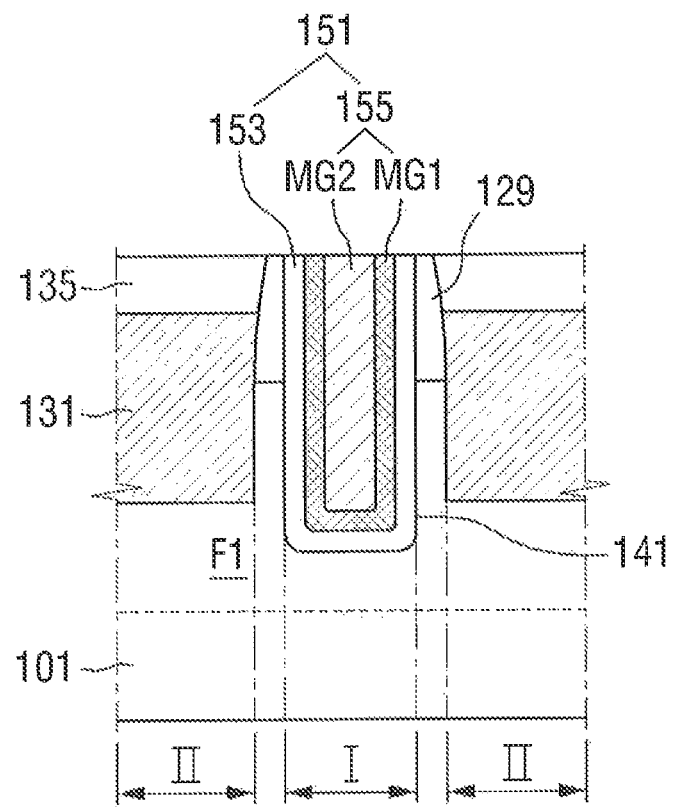
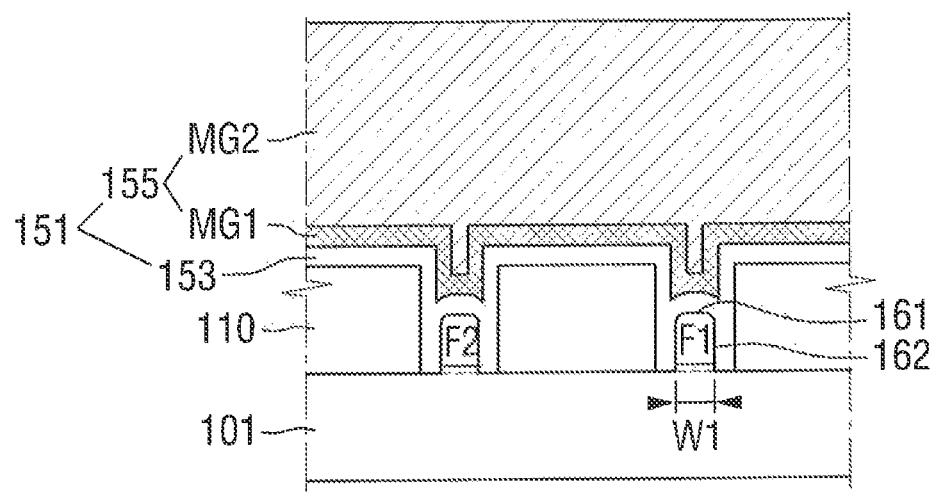

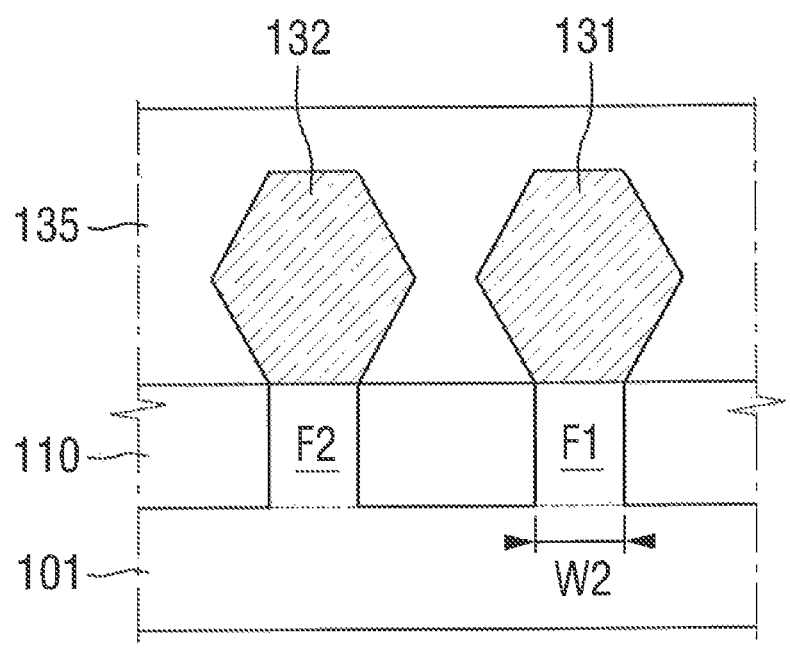

FIG. 14
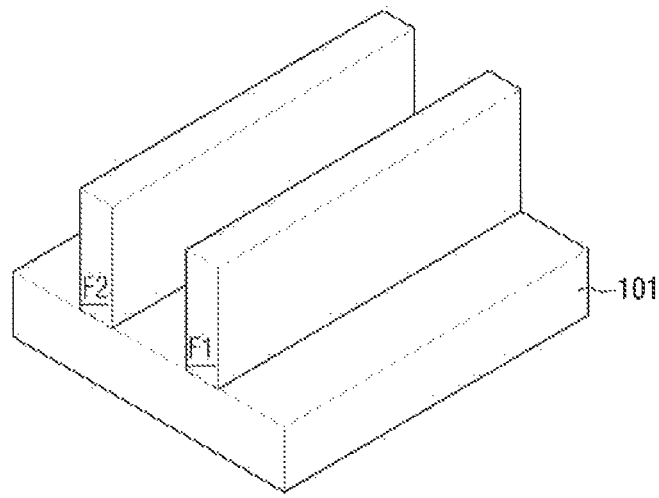
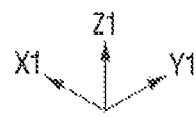
FIG. 15
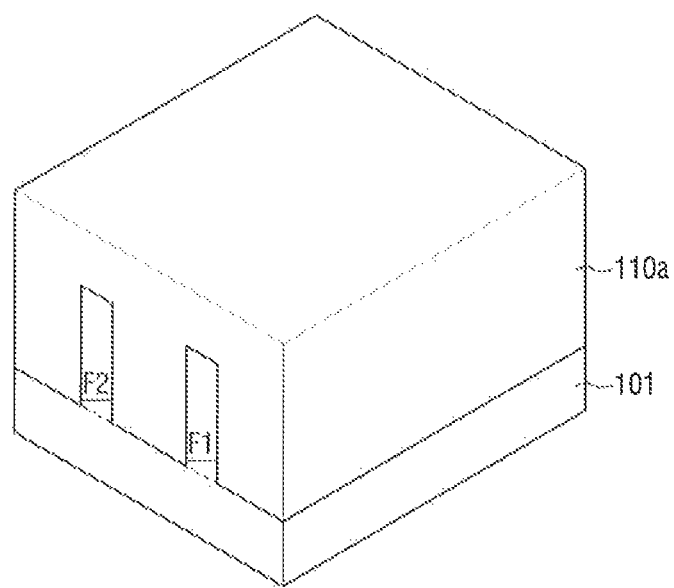
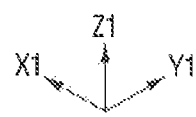

FIG. 17
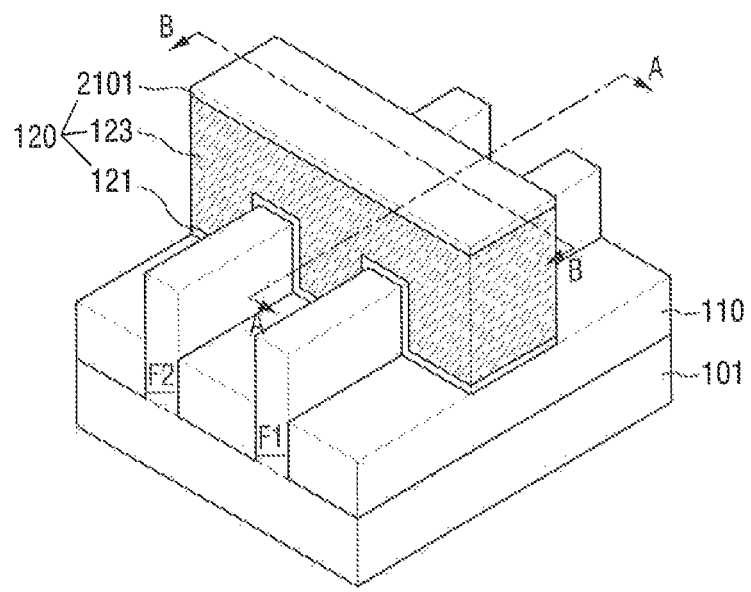
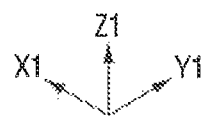
FIG. 18
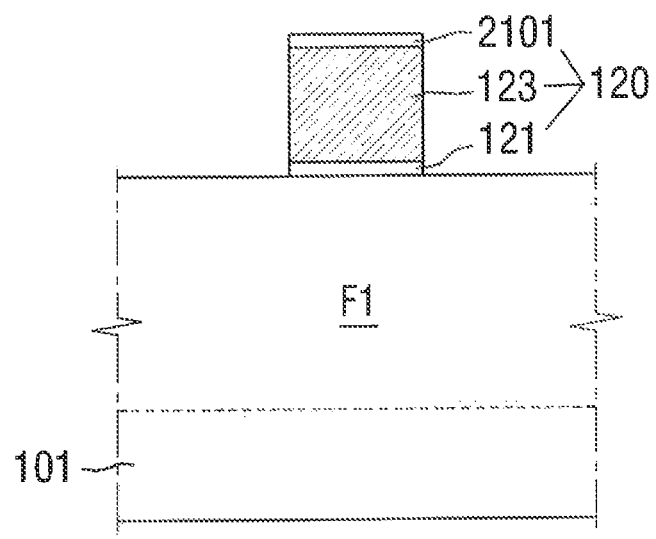

SEMICONDUCTOR DEVICE AND METHOD OF FABRICATING THE SAME

TECHNICAL FIELD

The present invention relates to a semiconductor device and a method of fabricating the same.

DISCUSSION OF RELATED ART

As more transistors are integrated in a smaller area, a multi-gate transistor structure has been proposed. In a multi-gate transistor, a fin or a nanowire-shaped silicon body is three-dimensionally formed on a substrate and a gate is formed thereon.

SUMMARY

According to an exemplary embodiment of the present inventive concept, a semiconductor device is provided. A substrate includes a fin. The fin extends in a first direction. A gate structure is disposed on a first region of the fin. The gate structure extends in a second direction crossing the first direction. A source/drain is disposed on a second region of the fin. The first source/drain is disposed on at least one sidewall of the gate structure. A top surface of the first region is lower than a top surface of the second region.

According to an exemplary embodiment of the present inventive concept, a semiconductor device is provided. A substrate includes a fin. The fin extends in a first direction. The fin includes a first region having a first width and a second region having a second width. The first and the second width are measured in a second direction crossing the first direction. An isolation layer is disposed on the substrate. The second region of the fin is in contact with the isolation layer. The first region of the fin is spaced apart from the isolation layer. A gate structure is disposed on the first region of the fin. A source/drain is disposed on the second region of the fin. According to an exemplary embodiment of the present inventive concept, a method of fabricating a semiconductor device is provided. A fin is formed on a substrate. The fin extends in a first direction. A first spacer and a second spacer are formed on the fin. A first region of the fin is defined as an inner region between the first spacer and the second spacer. A second region of the fin is defined as an outer region of the first spacer and the second spacer. The first region of the fin is etched to form a recess in the first region of the fin. A gate structure is formed in the recess. The gate structure extends in a second direction crossing the first direction.

BRIEF DESCRIPTION OF THE DRAWINGS

These and other features of the present inventive concept will become more apparent by describing in detail exemplary embodiments thereof with reference to the accompanying drawings of which:

FIG. 2 is a cross-sectional view taken along line A-A of FIG. 1;

FIG. 3 is a cross-sectional view taken along line B-B of FIG. 1;

FIG. 4 is a cross-sectional view taken along line C-C of FIG. 1;

FIGS. 14 to 28 illustrate a method of fabricating a semiconductor device according to an exemplary embodiment of the present inventive concept;

DETAILED DESCRIPTION OF EXEMPLARY EMBODIMENTS

Figure 1:
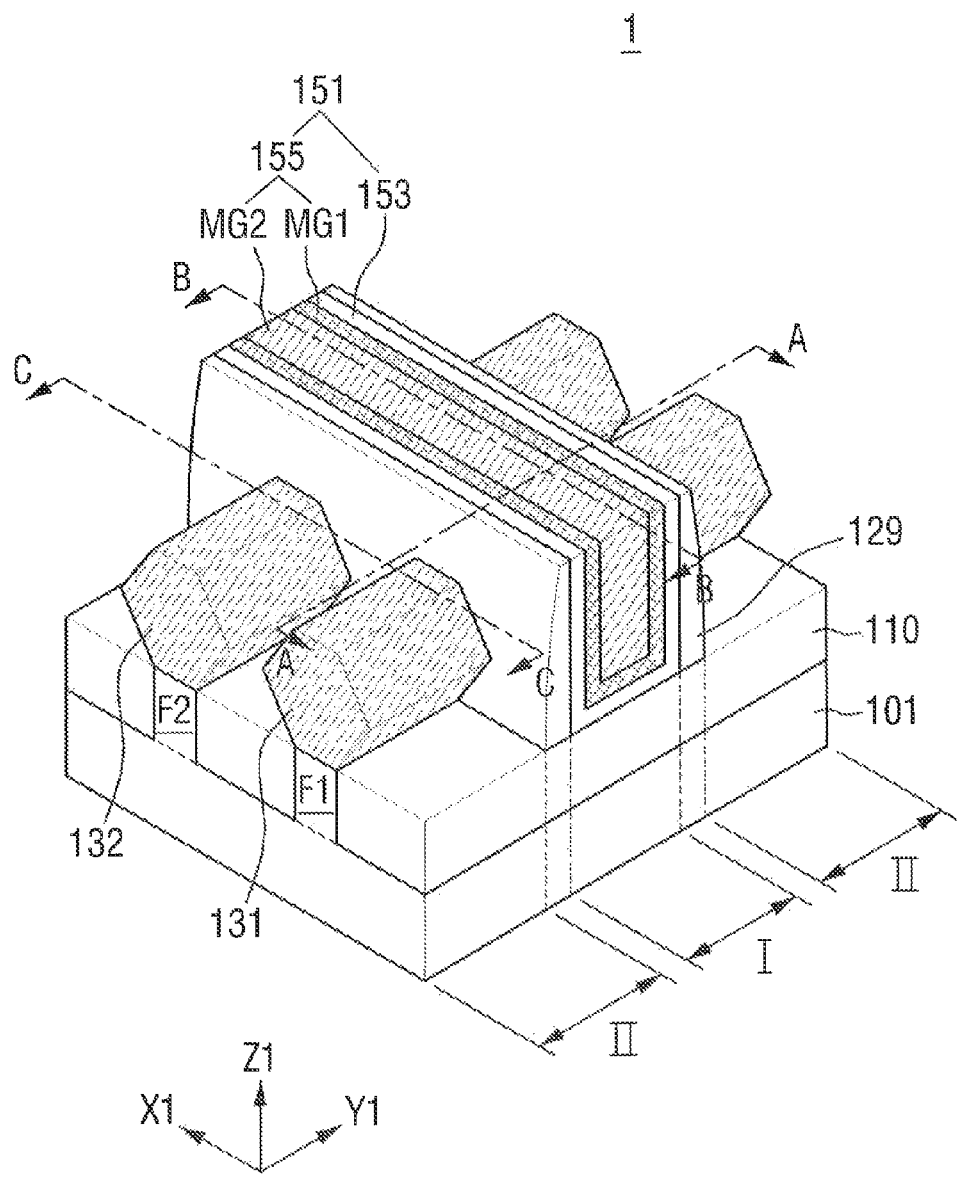
FIG. 1 is a perspective view of a semiconductor device according to an exemplary embodiment of the present inventive concept.

Exemplary embodiments of the present inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. Like reference numerals may refer to the like elements throughout the specification and drawings.

Hereinafter, a semiconductor device according to an exemplary embodiment of the present inventive concept will now be described with reference to FIGS. 1 to 4. FIG. 1 is a perspective view of a semiconductor device according to an exemplary embodiment of the present inventive concept, FIG. 2 is a cross-sectional view taken along line A-A of FIG. 1, FIG. 3 is a cross-sectional view taken along line B-B of FIG. 1, and FIG. 4 is a cross-sectional view taken along line C-C of FIG. 1.

Referring to FIGS. 1 to 4, the semiconductor device 1 includes a substrate 101, a first fin F1, a second fin F2, an isolation layer 110, a gate structure 151, sources/drains 131 and 132, and a first interlayer dielectric layer 135. For the convenience of a description, the first interlayer dielectric layer 135 of FIGS. 2 and 4 is not illustrated in FIG. 1.

The substrate 101 may be made of at least one of Si, Ge, SiGe, GaP, GaAs, SiC, SiGeC, InAs and InP. Alternatively, the substrate 10 may be a silicon-on-insulator (SOI) substrate.

The first fin F1 and the second fin F2 may be portions of the substrate 101. Alternatively, the first fin F1 and the second fin F2 may be an epitaxial layer grown from the substrate 101. The isolation layer 110 is formed on the substrate 101, covering at least portions of sidewalls of the first fin F1 and the second fin F2.

The first fin F1 and the second fin F2 extends lengthwise in a first direction (Y1 direction). For example, each of the first fin F1 and the second fin F2 has long sides and short sides. The first fin F1 and the second fin F2 extend lengthwise in a long side direction and may be parallel to each other to be adjacent to each other in a short side direction (X1 direction). In FIG. 1, the long side direction is the first direction (Y1 direction) and the short side direction is the second direction (X1 direction), but the present inventive concept is not limited thereto. For example, the long side direction may be the second direction (the X1 direction) and the short side direction may be the first direction (Y1 direction). In this case, the first fin F1 and the second fin F2 may be formed to be adjacent to each other in the first direction (Y1 direction).

Each of the first fin F1 and the second fin F2 include a first region I and a second region II. The first region I is disposed under the gate structure 151 and the second region II is disposed under the sources/drains 131 and 132. The first region I includes a recess 141. For example, the first region I of each of the first and second fins F1 and F2 is partially etched to have the recess 141, and the recess 141 is filled by the gate structure 151.

As shown in FIGS. 3 and 4, each of the first and second fins F1 and F2 is recessed in the first region I. The first region I is recessed such that the upper surfaces of the recessed first and second fins F1 and F2 are lower than the top surface of the isolation layer 110. Accordingly, as shown in FIG. 3 taken along line B-B of FIG. 1, the recessed first and second fins F1 and F2 have curved top surfaces 161 in the first region I. For example, the top surface 161 of the first region I has a convex and round surface. However, since the second region II is not recessed, it has its original shape, as shown in FIG. 4. In addition, the first region I does not have an angled portion on its surface. For example, the first region I may have an unangled, smooth surface.

Referring to FIGS. 3 and 4, a width W1 of the first region I is smaller than a width W2 of the second region II in the second direction (X1 direction), because the second region of the first and second fins is not recessed. In addition, the recess 141 has an arched shape and is filled by the gate structure 151. The gate structure 151 fills the recess 141 such that it is in contact with the top surface of the isolation layer 110 and at least portions of sidewalls of the isolation layer 110. In addition, the gate structure 151 is in contact with sidewalls 162 of the first and second fins F1 and F2. For example, the gate structure 151 is disposed on the isolation layer 110 and the first region I.

The bottom surface of the recess 141 of the first region I is lower than the top surface of the isolation layer 110 disposed on the second region II. For example, the bottom surface of recess 141 of the first region I is lower than the bottom surfaces of the sources/drains 131 and 132 disposed on the second region II. Alternatively, the bottom surface of the recess 141 may be substantially coplanar with the top surface the isolation layer 110.

The gate structure 151 intersects the first region I of the first fin F1 and the second fin F2. When the first and second fins F1 and F2 are formed in the first direction Y1, the gate structure 151 extends in the second direction X1 crossing the first direction Y1. The gate structure 151 is formed on the first region I.

The gate structure 151 fills the recess 141 of the first region I, and the bottom surface of the gate structure 151 is lower than the bottom surfaces of the sources/drains 131 and 132. The bottom surface of the gate structure 151 is lower than the bottom surfaces of the first and second fins F1 and F2.

The gate structure 151 includes a gate insulation layer 153 and the gate electrode 155. The gate electrode 155 includes metal layers MG1 and MG2. The first metal layer MG1 is stacked on the second metal layer MG2. Alternatively, the gate electrode 155 may include more than two metal layers. The first metal layer MG1 may serve to control a work function, and the second metal layer MG2 may fill a space formed by the first metal layer MG1. For example, the first metal layer MG1 may include at least one of TiN, TaN, TiC, and TaC. The second metal layer MG2 may include W or Al. Further, the gate electrode 155 may be made of Si or SiGe, instead of a metal. The gate electrode 155 may be formed by, for example, a replacement metal gate process, but the present inventive concept is not limited thereto.

The gate insulation layer 153 is disposed between the first and second fins F1 and F2 and the gate electrode 155. As shown in FIG. 3, the gate insulation layer 153 is formed on the top surfaces and sidewalls of the first and second fins F1 and F2. In addition, the gate insulation layer 153 is disposed between the gate electrode 155 and the isolation layer 110. The gate insulation layer 153 may include a high-k dielectric material having a higher dielectric constant than a silicon oxide film. For example, the gate insulating layer 153 may include $HfO_2$, $ZrO_2$, or $Ta_2O_5$.

In FIG. 3, only the gate insulation layer 153 is disposed between the isolation layer 110 and the first and second fins F1 and F2, but the present inventive concept is not limited thereto. For example, at least one of the first and second metal layers MG1 and MG2 may be disposed between the first and second fins F1 and F2, and the isolation layer 110 depending on the width W1 of the first and second fins F1 and F2, the thickness of the gate insulation layer 153 and the thickness of the gate electrode 155.

The spacer 129 is disposed on sidewalls of the gate structure 151. The space 129 may include at least one of a nitride layer and an oxynitride layer. The spacer 129 is disposed between the gate structure 151 and the sources/drains 131 and 132. The gate structure 151 extending in the second direction X1 is disposed on the first region I and the second region II.

The sources/drains 131 and 132 are formed on at least one side of the gate structure 151. For example, the first source/drain 131 is formed on the second region II of the first fin F1, and the second source/drain 132 is formed on the second region II of the second fin F2. The sources/drains 131 and 132 are elevated sources/drains. The sources/drains 131 and 132 are insulated from the gate electrode 155 using the spacer 129. The sources/drains 131 and 132 are formed using an epitaxial growth process.

For a PMOS transistor, the sources/drains 131 and 132 include a tensile stress material. For example, the sources/drains 131 and 132 may include a material having a larger lattice constant than Si (e.g., SiGe). The compressive stress material may increase the mobility of carriers of a channel region in the first region I by applying compressive stress to the first and second fins F1 and F2.

For an NMOS transistor, the sources/drains 131 and 132 includes the same material as the substrate 101 or a tensile stress material. For example, when the substrate 101 includes Si, the sources/drains 131 and 132 may include Si or a material having a smaller lattice constant than Si (e.g., SiC).

For example, the sources/drains 131 and 132 are diamond-shaped in a cross-sectional view taken along line C-C of FIG. 1. Alternatively, the sources/drains 131 and 132 may be circular in a cross-sectional view taken along line C-C of FIG. 1. In FIGS. 1 and 4, diamond-shaped (or pentagonal or hexagonal) sources/drains 131 and 132 are illustrated.

The first interlayer dielectric layer 135 is formed on the isolation layer 110. The first interlayer dielectric layer 135 covers the sources/drains 131 and 132 and the sidewalls of the gate structure 151.

As shown in FIG. 2, the top surface of the first interlayer dielectric layer 135 is substantially coplanar with the top surface of the gate electrode 155. The top surfaces of the first interlayer dielectric layer 135 and the gate structure 151 may be substantially coplanar with each other using a planarization process, for example, a chemically-mechanical-polishing (CMP) process. The first interlayer dielectric layer 135 may include at least one of a nitride layer and an oxynitride layer.

Figure 5:
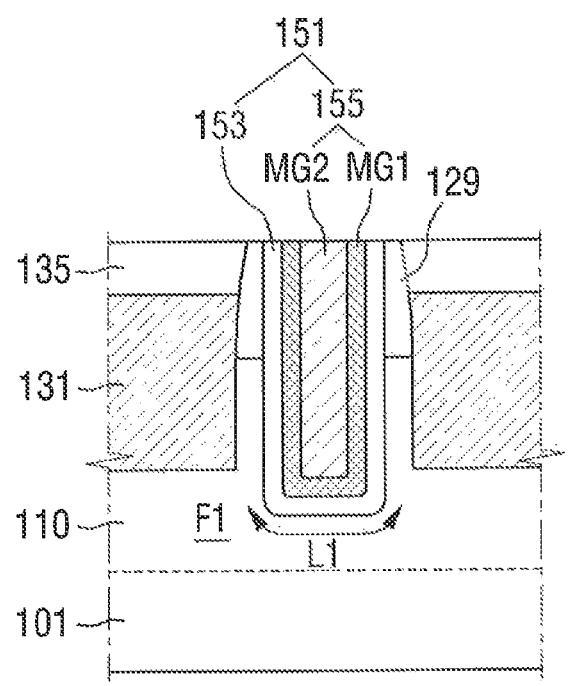
FIG. 5 illustrates a channel region of a semiconductor device according to an exemplary embodiment of the present inventive concept.

Hereinafter, the inventive concept will be described with reference to FIG. 5. FIG. 5 illustrates a channel region formed under the bottom surface of the gate structure 151 according to an exemplary embodiment of the present inventive concept.

The channel region is disposed in the first fin F1 below the gate structure 151. The channel region is disposed between the two first source/drains 131 disposed on both sides of the gate structure 151. Electrons and/or holes move in the channel region along the first direction (Y-direction). Since the gate structure 151 is disposed in a recess 141 of the first fin F1, the channel length L1 increases as the depth of the recess 141 increases. Accordingly, when a transistor is getting smaller so that more transistors are packed in a smaller area, a channel length of a transistor may be secured such that a short channel effect (SCE) is prevented. As shown in FIG. 5, since the gate structure 151 is formed between the two first source/drains 131, the channel region of the first fin F1 is U-shaped.

The channel region of the first fin F1 includes round corners such that a bottleneck of electrons and/or holes is prevented when electrons and/or holes move along the channel region. Such bottleneck may reduce mobility of electrons and/or holes. When the channel region may include angled corners, a leakage current path may be formed through the angled corners. Therefore, the recess having round corners may suppress CCE and leakage current from a transistor.

Hereinafter, a semiconductor device according to an exemplary embodiment of the present inventive concept will be described with reference to FIG. 6. In the following description, the same content as that of the previous exemplary embodiment will be omitted and the following description will focus on differences between the present and previous exemplary embodiments of the present inventive concept. For the convenience of a description, a first interlayer dielectric layer 135 and a second interlayer dielectric layer 137 are not illustrated in FIG. 6.

Figure 6:
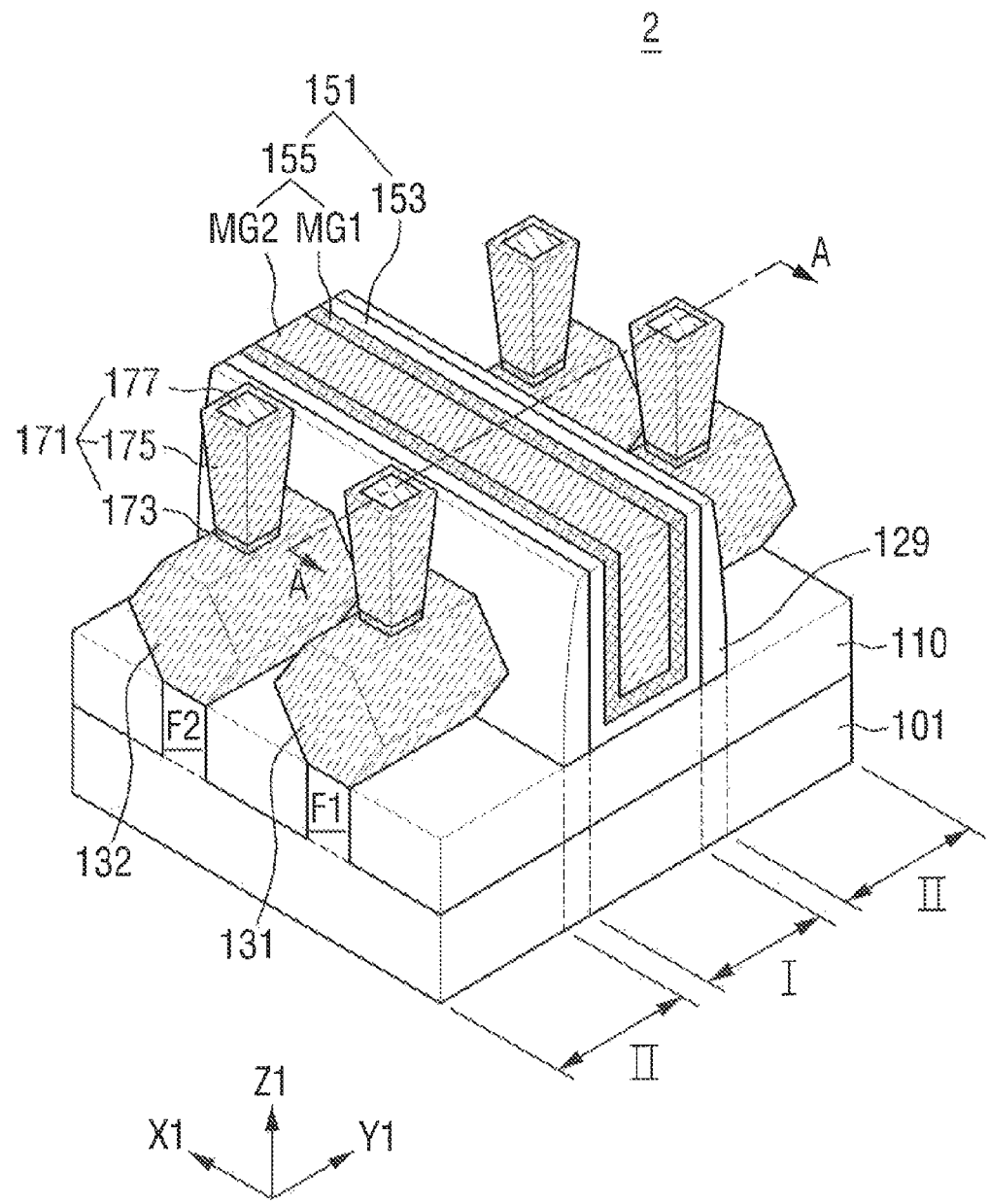
FIG. 6 is a perspective view of a semiconductor device according to an exemplary embodiment of the present inventive concept.
Figure 7:
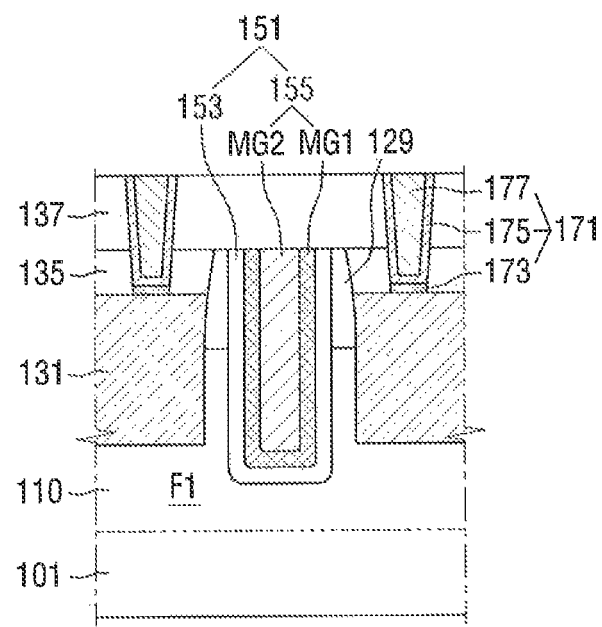
FIG. 7 is a cross-sectional view taken along line A-A of FIG. 6.

FIG. 6 is a perspective view of a semiconductor device according to an exemplary embodiment of the present inventive concept and FIG. 7 is a cross-sectional view taken along line A-A of FIG. 6.

Referring to FIG. 6, the semiconductor device 2 is substantially the same as the semiconductor device 1 of FIG. 1, except that a contact 171 is formed on sources/drains 131 and 132.

The contact 171 is disposed on the source/drain 131 and is in contact with the source/drain 131.

The contact 171 electrically connects an interconnection and the source/drain 131. The contract 171 may include a silicide layer 173, a first conductive layer 175 and a second conductive layer 177. The silicide layer 173 is disposed on the bottom surface of the contact 171 to be in contact with the source/drain 131. The first and second conductive layers 175 and 177 are disposed on the silicide layer 173.

The first conductive layer 175 constitutes outermost sidewalls of the contact 171, the second conductive layer 177 constitutes innermost layers of the contact 171. For example, the first conductive layer 175 surrounds the second conductive layer 177. The first and second conductive layers 175 and 177 are disposed on the silicide layer 173.

The silicide layer 173 may include a conductive material, for example, Pt, Ni, or Co, but the present inventive concept is not limited thereto.

The first and second conductive layers 175 and 177 may include a conductive material. For example, the first conductive layer 175 may include Ti, TiN, etc., and the second conductive layer 177 may include W, Al, Cu, etc., but the present inventive concept is not limited thereto.

The first interlayer dielectric layer 135 and the second interlayer dielectric layer 137 are sequentially formed on the isolation layer 110. The first interlayer dielectric layer 135 covers the source/drain 131 and portions of sidewalls of the contact 171. The second interlayer dielectric layer 137 covers the remaining portions of the sidewalls of the contact 171 and the gate structure 151. The second interlayer dielectric layer 137 may include substantially the same material with the first interlayer dielectric layer 135, for example, at least one of a nitride layer and an oxynitride layer, but the present inventive concept is not limited thereto.

Hereinafter, a semiconductor device according an exemplary embodiment of the present inventive concept will be described with reference to FIG. 8. In the following description, the same content as that of the previous exemplary embodiment will be omitted and the following description will focus on differences between the present and previous exemplary embodiments of the present inventive concept.

Figure 8:
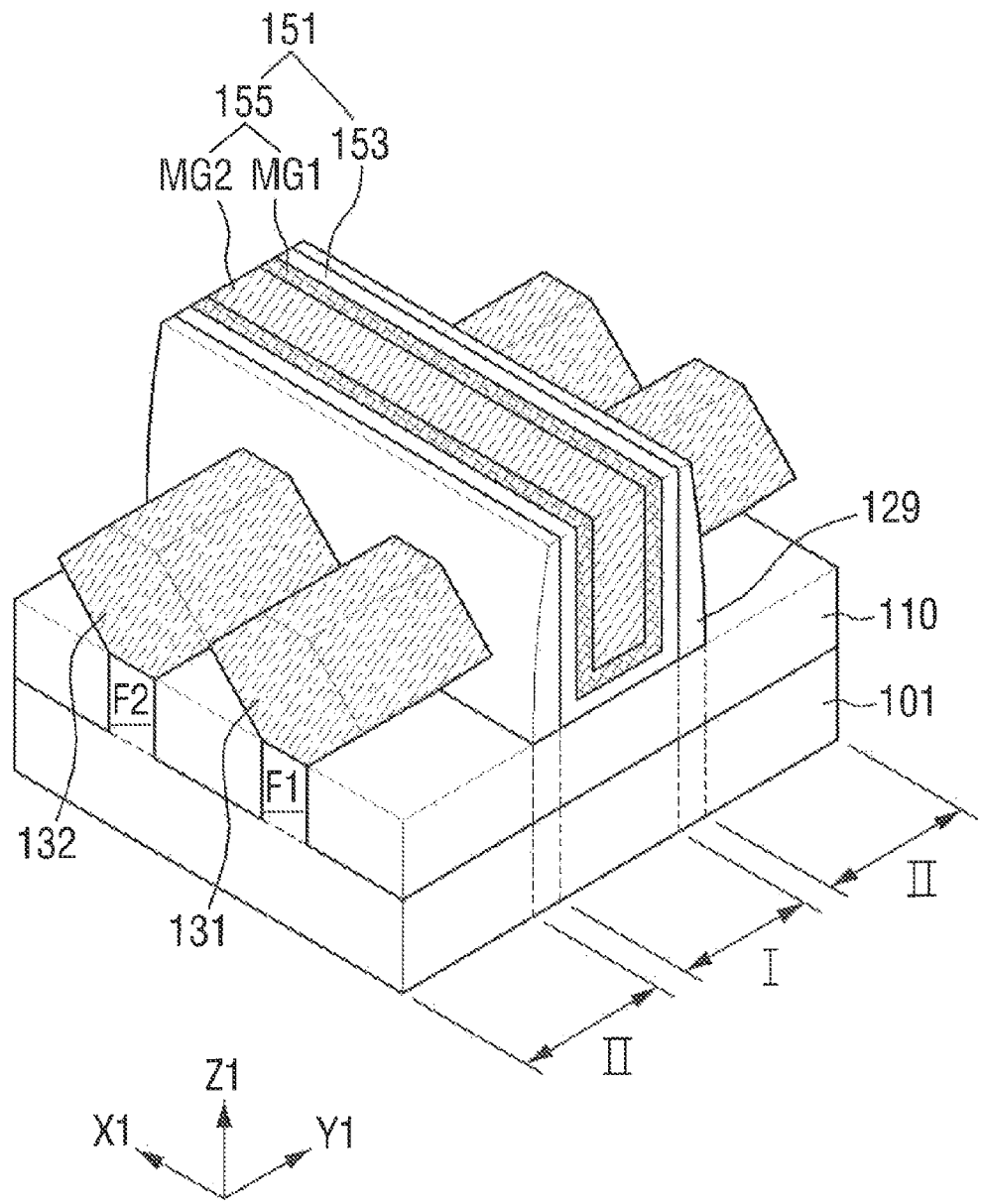
FIG. 8 is a perspective view of a semiconductor device according to an exemplary embodiment of the present inventive concept.

FIG. 8 is a perspective view of a semiconductor device according to an exemplary embodiment of the present inventive concept.

Referring to FIG. 8, the semiconductor device 3 is substantially the same as the semiconductor device 1 of FIG. 1, except for the shapes of sources/drains 131 and 132. As shown in FIG. 8, a first source/drain 131 formed on a first fin F1 and a second source/drain 132 formed on a second fin F2 are in contact with each other. The first and second sources/drains 131 and 132 are in contact with each other during an epitaxial growth process. If the distance between the first and second fins F1 and F2 is relatively small, the first and second sources/drains 131 and 132 may be in contact with each other.

Hereinafter, a memory cell employing a semiconductor device according to an exemplary embodiment of the present inventive concept will be described with reference to FIGS. 9 and 10. The exemplary memory cell includes a memory cell of a static random access memory (SRAM) device.

Figure 9:
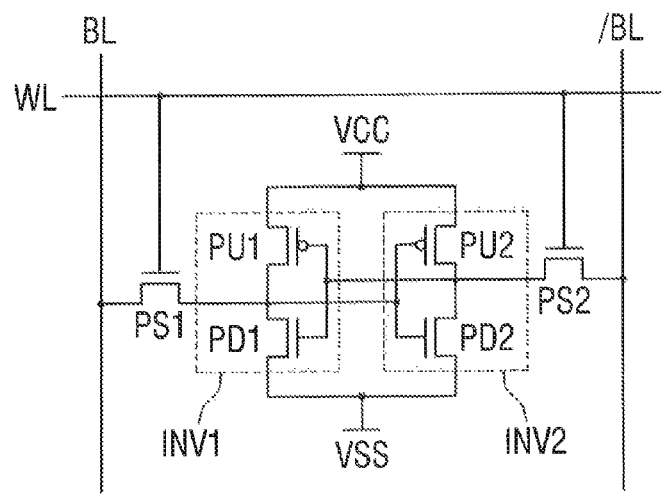
FIGS. 9 and 10 are a circuit diagram and a layout of a memory cell employing a semiconductor device according to an exemplary embodiment of the present inventive concept.
Figure 10:
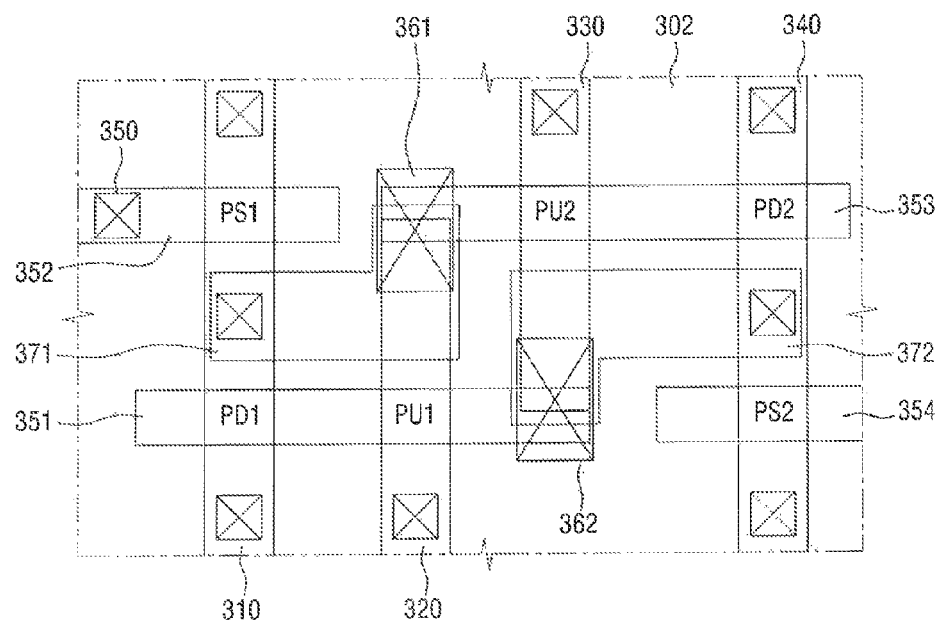

FIGS. 9 and 10 are a circuit diagram and a layout of a SRAM memory cell employing a semiconductor device according to an exemplary embodiment of the present inventive concept. The semiconductor device according to an exemplary embodiment of the present inventive concept may be applied to a device including a general logic device using a fin-type transistor, but an SRAM cell is exemplified in FIGS. 9 and 10.

First, referring to FIG. 9, the SRAM memory cell includes a pair of inverters INV1 and INV2 connected in parallel between a power supply node Vcc and a ground node Vss, and a first pass transistor PS1 and a second pass transistor PS2 connected to output nodes of the respective inverters INV1 and INV2. The first pass transistor PS1 and the second pass transistor PS2 are connected to a bit line BL and a complementary bit line BL/, respectively. Gates of the first pass transistor PS1 and the second pass transistor PS2 are connected to a word line WL.

The first inverter INV1 includes a first pull-up transistor PU1 and a first pull-down transistor PD1 connected in series to each other, and the second inverter INV2 includes a second pull-up transistor PU2 and a second pull-down transistor PD2 connected in series to each other. The first pull-up transistor PU1 and the second pull-up transistor PU2 are PMOS transistors, and the first pull-down transistor PD1 and the second pull-down transistor PD2 are NMOS transistors.

An input node of the first inverter INV1 is connected to an output node of the second inverter INV2 and an input node of the second inverter INV2 is connected to an output node of the first inverter INV1. Such connection makes the two inverters INV1 and INV2 operate as a latch configured to store a data.

Figure 26:
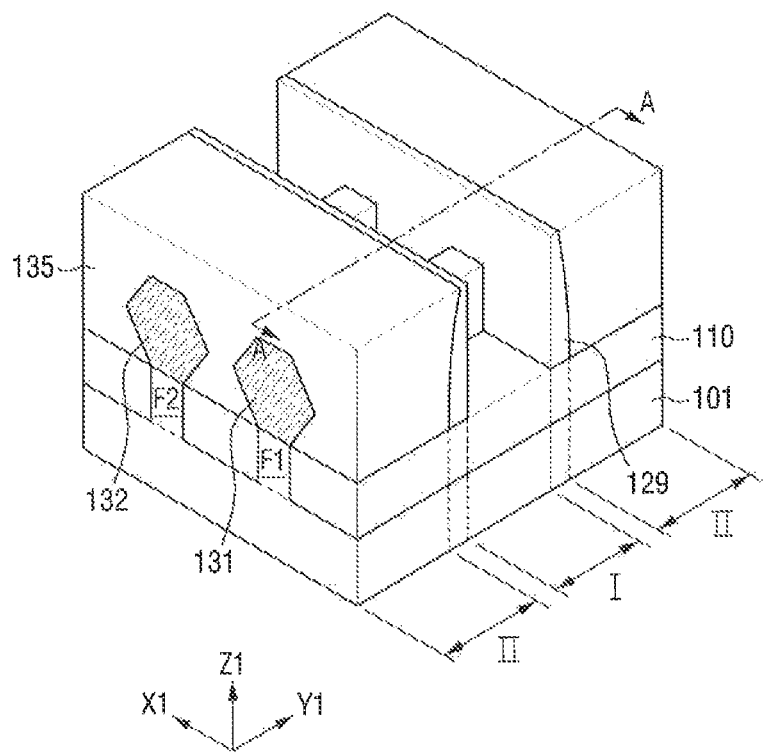

Referring to FIGS. 9 and 10, a first fin 310, a second fin 320, a third fin 330 and a fourth fin 340, which are spaced apart from one another, extend lengthwise in a first direction (Y1 direction of FIG. 26).

In addition, a first gate electrode 351, a second gate electrode 352, a third gate electrode 353, and a fourth gate electrode 354 extend lengthwise in a second direction (X1 direction of FIG. 26) to intersect the first fin 310 to the fourth fin 340. For example, the first gate electrode 351 completely intersects the first fin 310 and the second fin 320 while partially overlapping an end of the third fin 330. The third gate electrode 353 completely intersects the fourth fin 340 and the third fin 330 while partially overlapping an end of the second fin 320. The second gate electrode 352 and the fourth gate electrode 354 intersect the first fin 310 and the fourth fin 340, respectively.

As shown in FIGS. 9 and 10, the first pull-up transistor PU1 includes an intersection of the first gate electrode 351 and the second fin 320, the first pull-down transistor PD1 includes an intersection of the first gate electrode 351 and the first fin 310, and the first pass transistor PS1 includes an intersection of the second gate electrode 352 and the first fin 310. The second pull-up transistor PU2 includes an intersection of the third gate electrode 353 and the third fin 330, the second pull-down transistor PD2 includes an intersection of the third gate electrode 353 and the fourth fin 340, and the second pass transistor PS2 includes an intersection of the fourth gate electrode 354 and the fourth fin 340.

Although not shown, sources/drains may be formed at opposite sides of the respective intersections of the first to fourth gate electrodes 351-354 and the first to fourth fins 310, 320, 330 and 340.

In addition, a plurality of contacts 350 is formed.

The second active region 320, a third gate line 353 and an interconnection 371 are connected to each other using a shared contact 361. The third active region 330, a first gate line 351 and an interconnection 372 are connected to each other using a shared contact 362.

The first pull-up transistor PU1, the second pull-up transistor PU2, the first pull-down transistor PD1 and the second pull-down transistor PD2 employ a semiconductor device according to an exemplary embodiment.

FIG. 1 is a block diagram of an electronic system employing a semiconductor device according to an exemplary embodiment of the present inventive concept.

Figure 11:
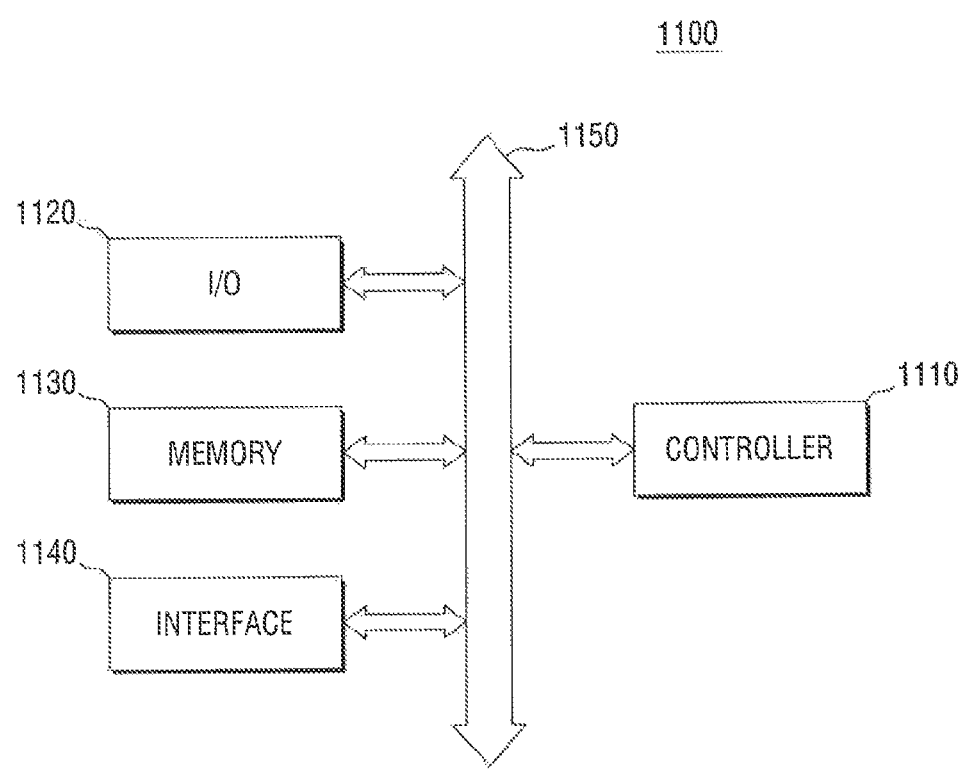
FIG. 11 is a block diagram of an electronic system including a semiconductor device according to an exemplary embodiment of the present inventive concept.

Referring to FIG. 11, the electronic system 1100 includes a controller 1110, an input/output device (I/O) 1120, a memory 1130, an interface 1140 and a bus 1150. The controller 1110, the I/O 1120, the memory 1130, and/or the interface 1140 are connected to each other using the bus 11500. The bus 1150 corresponds to a path through which data moves.

The controller 1110 may include at least one of a microprocessor, a digital signal processor, a microcontroller, and logic elements having functions similar to those of these elements. The I/O 1120 may include a key pad, a key board, a display device, and so on. The memory 1130 may store data and/or codes. The interface 1140 may perform functions of transmitting data to a communication network or receiving data from the communication network. The interface 1140 may be wired or wireless. For example, the interface 1140 may include an antenna or a wired/wireless transceiver, and so on. Although not shown, the electronic system 1100 may further include a high-speed DRAM device and/or an SRAM device as the operating memory for increasing the operation of the controller 1110. The memory 1130, the controller 1110 and/or the I/O 1120 may employ a semiconductor device according to an exemplary embodiment.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 12:
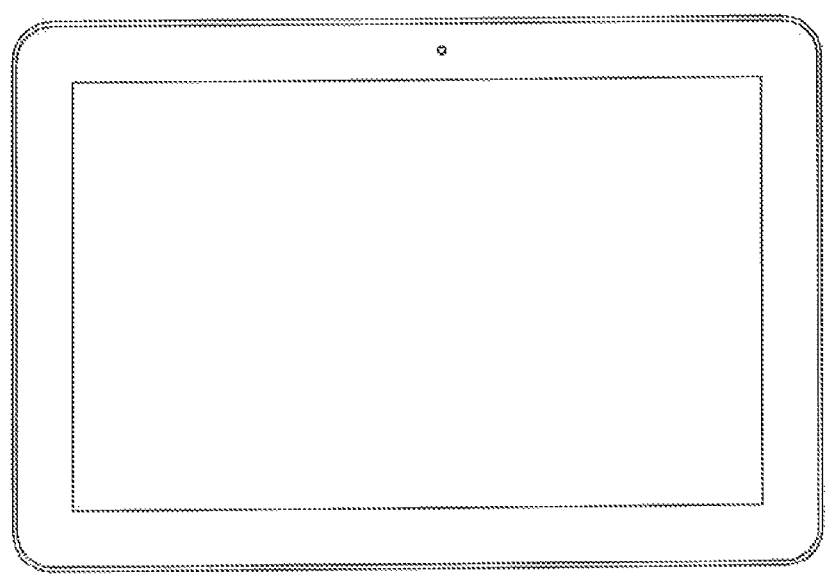
FIGS. 12 and 13 illustrate exemplary semiconductor systems employing a semiconductor device according to an exemplary embodiment of the present inventive concept.
Figure 13:
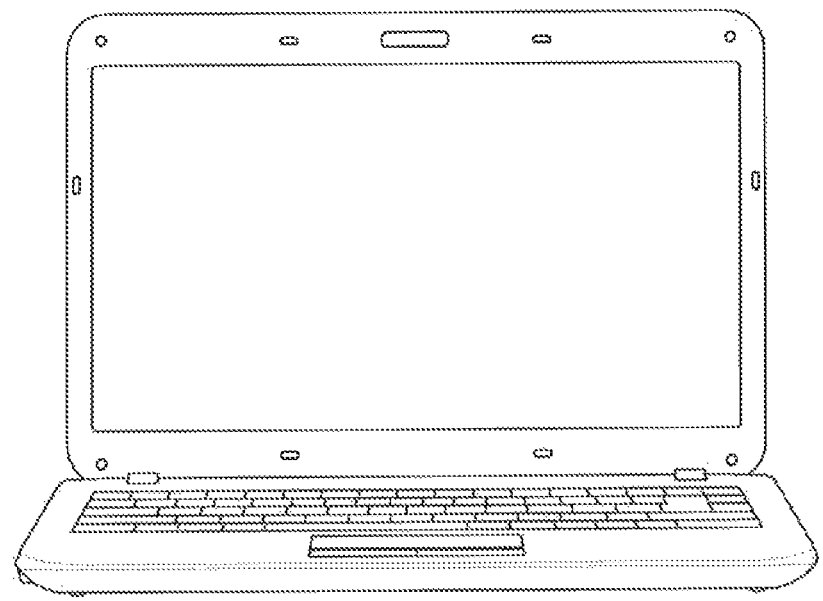

FIGS. 12 and 13 illustrate an exemplary application system employing a semiconductor device according to an exemplary embodiments of the present inventive concept.

FIG. 12 illustrates a tablet PC, and FIG. 13 illustrates a notebook computer. Such application systems include at least one semiconductor device according to an exemplary embodiments of the present inventive concept. The application system employing a semiconductor device according to an exemplary embodiment is not limited thereto. Other application systems such as a mobile phone may employ a semiconductor device according to an exemplary embodiment.

Hereinafter, a method for fabricating a semiconductor device according to an exemplary embodiment of the present inventive concept will be described with reference to FIGS. 1 to 4 and 14 to 31.

FIGS. 14 to 28 illustrate a method of fabricating a semiconductor device according to an exemplary embodiment of the present inventive concept. FIGS. 14 to 17, 20, 22, 24 to 26 and 28 are perspective views illustrating a method of fabricating a semiconductor device according to an exemplary embodiment of the present inventive concept, FIGS. 18, 21, 23, 27 and 29 are cross-sectional views taken along line A-A of FIGS. 17, 20, 22, 26 and 28, FIGS. 19 and 30 are cross-sectional views taken along line B-B of FIGS. 17 and 28, and FIG. 31 is a cross-sectional view taken along line C-C of FIG. 28.

First, referring to FIG. 14, first and second fins F1 and F2 are formed on a substrate 101. The first and second fins F1 and F2 protrude in a third direction Z1. The first fin F1 and the second fin F2 are spaced apart from each other in a second direction X1 to be parallel to each other. The first and second fins F1 and F2 are adjacent to each other and extend in a long side direction (first direction Y1).

To form the first and second fins F1 and F2, for example, a mask pattern is formed to cover regions to be the fins F1 and F2, followed by performing a etching process, thereby forming the first and second fins F1 and F2, but the present inventive concept is not limited thereto.

The first and second fins F1 and F2 are shaped of a rectangular parallelepiped, but the present inventive concept is not limited thereto. For example, the first and second fins F1 and F2 may be chamfered. For example, corners and/or edges of the first and second fins F1 and F2 may be rounded. Since the first and second fins F1 and F2 extend lengthwise in the first direction Y1, they have long sides formed along the first direction Y1 and short sides formed along the second direction X1. If the corners and/or edges of the first and second fins F1 and F2 are rounded, the long sides and the short sides are determined in a similar way. For example, the long, round sides are along the first direction Y1, and the short, round sides are formed along the second direction X1.

Referring to FIG. 15, an insulation layer 110a is formed on the substrate 101. The insulation layer 110a covers the first and second fins F1 and F2. The insulation layer 110a may include at least one of a silicon oxide layer, a silicon nitride layer, and a silicon oxynitride layer.

Figure 16:
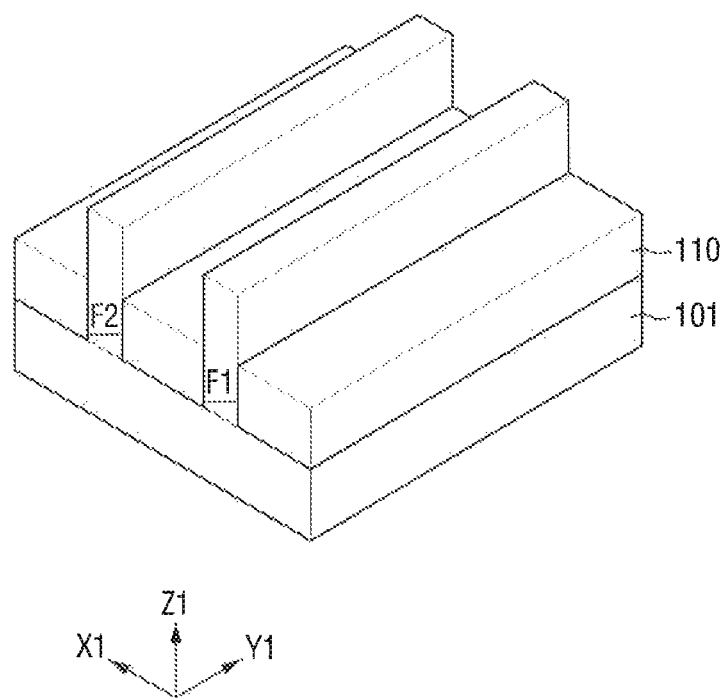

Referring to FIG. 16, the insulation layer 110a is etched to form an isolation layer 110. Upper portions of the first and second fins F1 and F2 are exposed by etching the insulation layer 110a. The isolation layer 110 covers the substrate 101 and lower portions of the first and second fins F1 and F2. For example, the isolation layer 110 covers portions of the sidewalls of the first and second fins F1 and F2.

Alternatively, portions of the first and second fins F1 and F2 upwardly protruding from the isolation layer 110 may be formed by an epitaxial process. For example, after forming the isolation layer 110, the portions of the first and second fins F1 and F2 may be formed using the epitaxial process in which the top surfaces of the first and second fins F1 and F2 exposed by the isolation layer 110 are used as seeds. In this case, a recess process need not be performed.

A doping process for adjusting a threshold voltage is performed on the first and second fins F1 and F2. For example, in a case of forming an NMOS transistor, a doped impurity may include boron (B), and in a case of forming a PMOS transistor, a doped impurity may include phosphorus (P) or arsenic (As). When the first and second fins F1 and F2 are formed using an epitaxial process, such impurities may be doped in situ while the first and second fins F1 and F2 is epitaxially grown.

Figure 19:
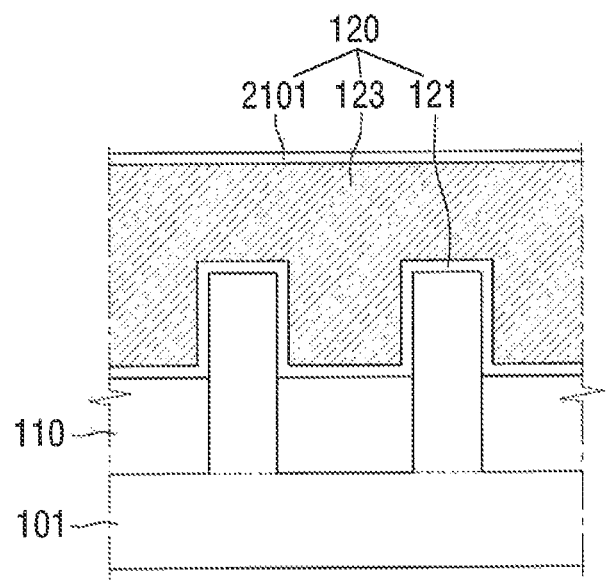

Referring to FIGS. 17 to 19, a dummy gate 120 is formed. The dummy gate 120 intersects the first and second fins F1 and F2, extending in the second direction X1. The dummy gate 120 is formed by performing an etching process using a mask pattern 2101. As shown in FIG. 19, the dummy gate 120 covers the sidewalls and top surfaces of the exposed top portions of the first and second fins F1 and F2 on the isolation layer 110.

Alternatively, if the first and second fins F1 and F2 extend in the second direction X1, the dummy gate 120 extends in the first direction Y1.

The dummy gate 120 includes a dummy gate insulation layer 121 and a first dummy gate electrode 123. For example, the dummy gate insulation layer 121 may include silicon oxide, and the dummy gate electrode 123 may include polysilicon.

Figure 20:
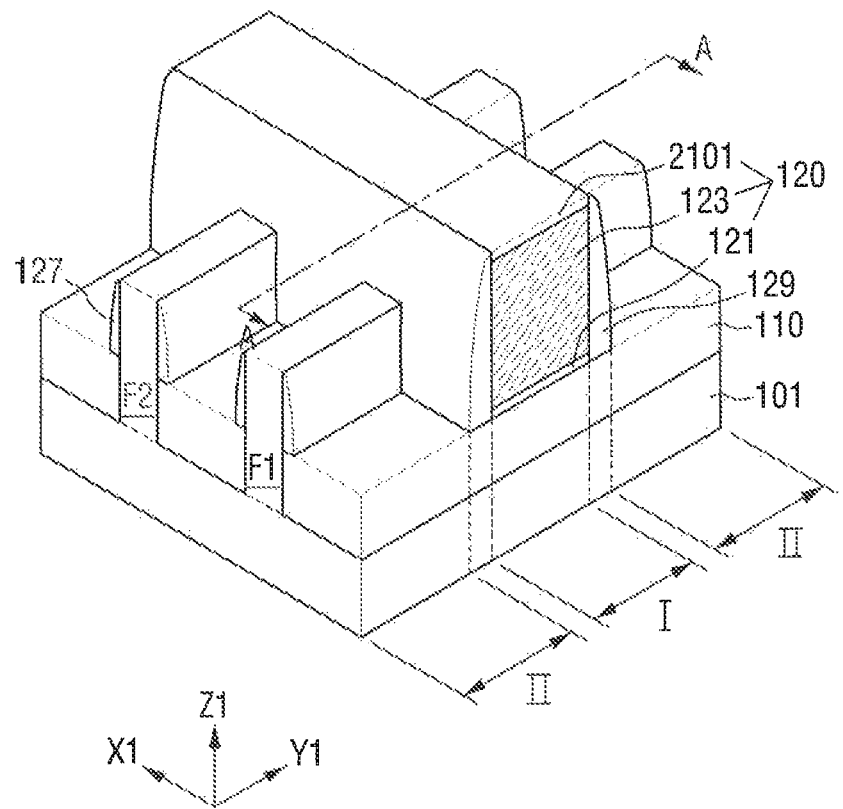
Figure 21:
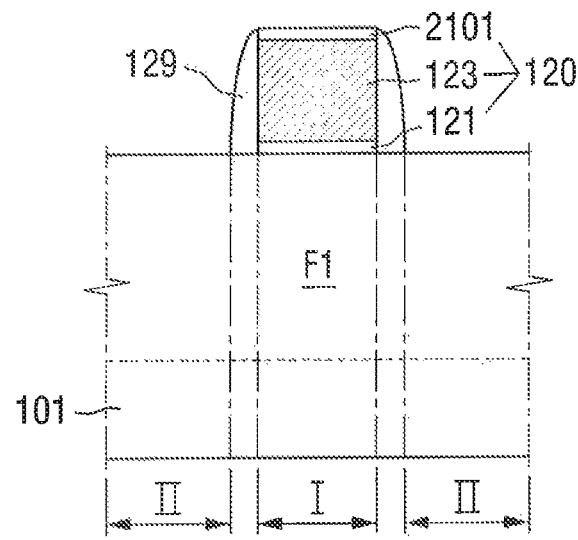

Referring to FIGS. 20 and 21, a spacer 129 is formed on sidewalls of the dummy gate electrode 123, exposing the top surface of the mask pattern 2101. The spacer 129 may include, for example, a silicon nitride layer or a silicon oxynitride layer.

The first and second fins F1 and F2 include the first region I and the second region II. A gate structure 151 will be formed on the first region I, and the dummy gate 120 is formed on the first region I. The sources/drains 131 and 132 are formed on the second region II before the dummy gate 120 is formed, and are disposed at both sides of the spacer 129.

A fin spacer 127 is formed on the sidewalls of the first and second fins F1 and F2. The exposed sidewalls of the first and second fins F1 and F2 protrudes from the isolation layer 110. For example, the fin spacer 127 is formed on the second region II of the of each of the first and second fins F1 and F2. The fin spacer 127 may include, for example, a silicon nitride layer or a silicon oxynitride layer. The fin spacer 127 may be simultaneously formed when the spacer 129 is formed.

Figure 22:
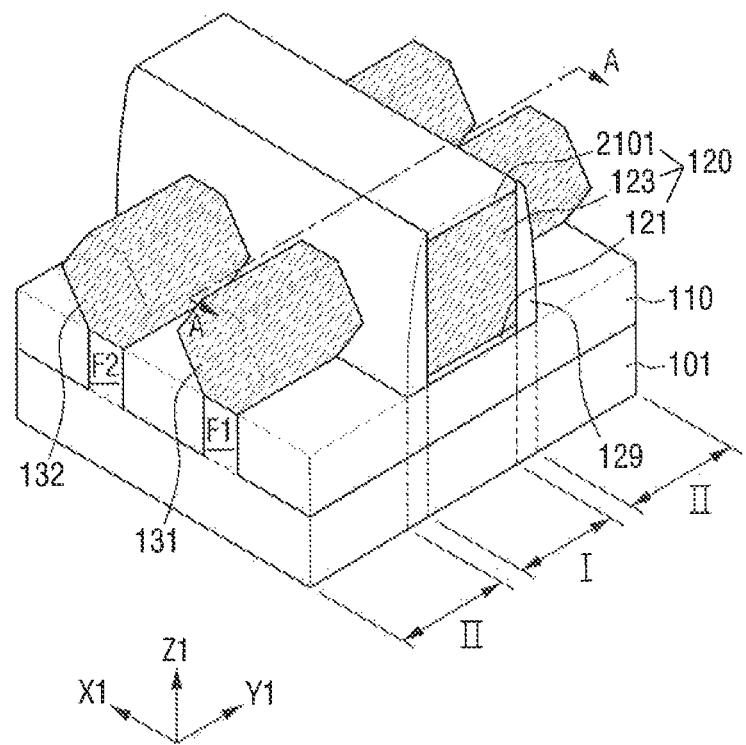
Figure 23:
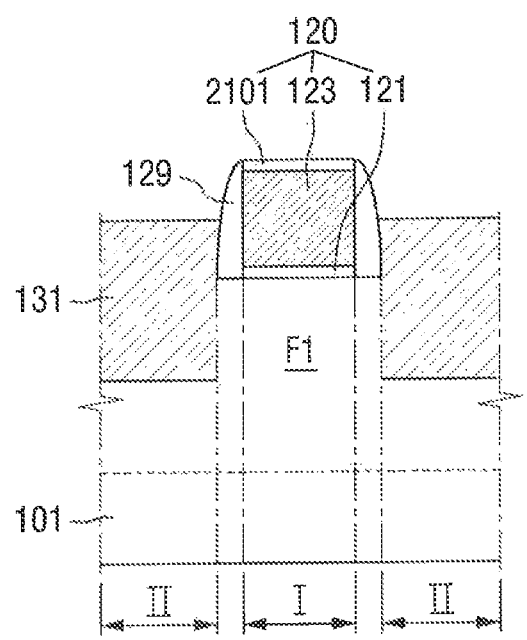

Referring to FIGS. 22 and 23, portions of the first and second fins F1 and F2 disposed on the second region II are partially removed such that the top surfaces of the second region are substantially coplanar with the top surface of the isolation layer 110. Sources/drains 131 and 132 are formed on the top surfaces of the first and second fins F1 and F2. The fin spacer 127 is removed when the portions of the first and second fins F1 and F2 are removed, but the present inventive concept is not limited thereto. For example, a portion of the fin spacer 129 may remain after the portions of the first and second fins F1 and F2 are removed.

The first and second source/drains 131 and 132 are formed on the second region II. The sources/drains 131 and 132 are formed using an epitaxial growth process. The top surfaces of the sources/drains 131 and 132 are higher than the top surface of the substrate 101. The sources/drains 131 and 132 may be referred to as elevated sources/drains. The sources/drains 131 and 132 may be separated from the dummy gate 120 by the spacer 129. The sources/drains 131 and 132 may include substantially the same materials as described above, and a detailed description thereof will be omitted.

Figure 24:
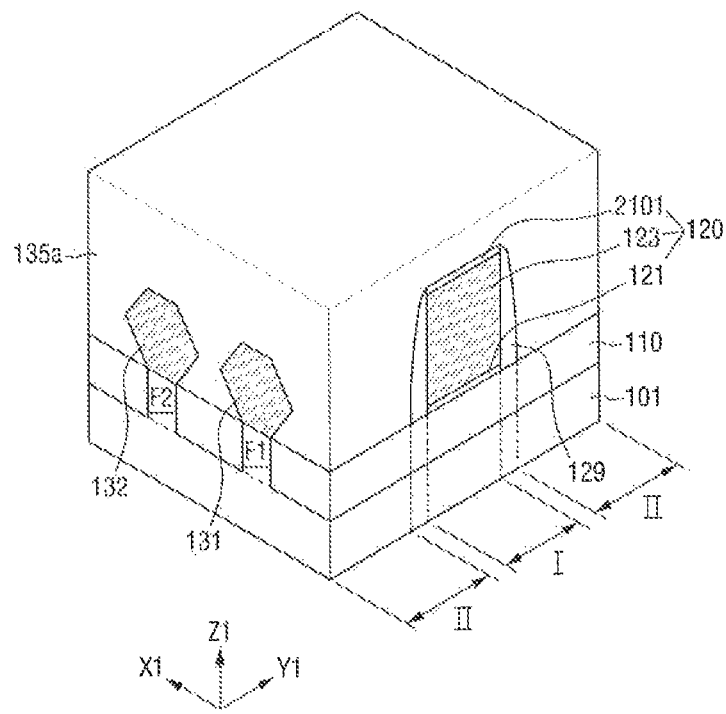

Referring to FIG. 24, an interlayer dielectric layer 135a is formed on the resultant structure of FIG. 22. The interlayer dielectric layer 135a may include, for example, at least one of an oxide layer, a nitride layer, and an oxynitride layer.

Figure 25:
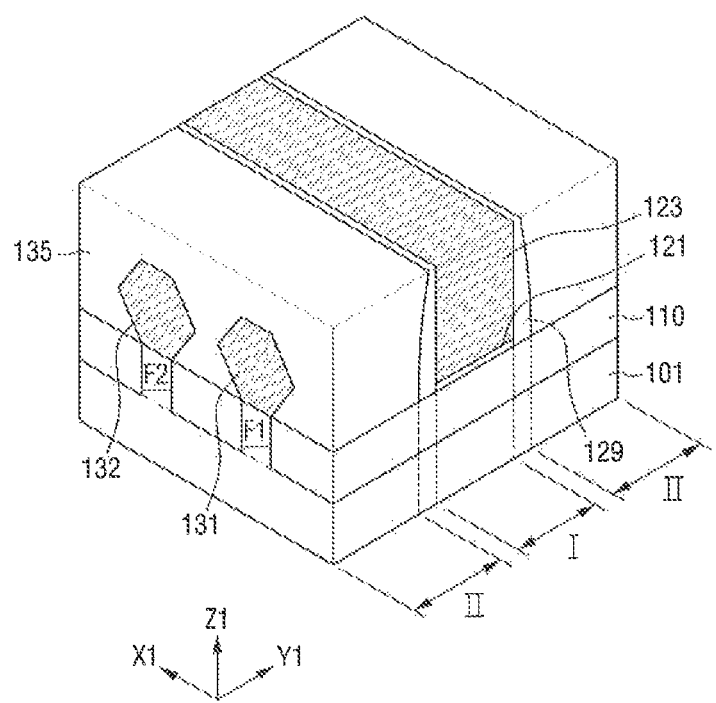

Referring to FIG. 25, the interlayer dielectric layer 135a is planarized using a CMP process until the top surface of the dummy gate electrode 123 is exposed. For example, the CMP process is performed to remove the interlayer dielectric layer 135a and the mask pattern 2101 until the top surface of the dummy gate electrode 123 is exposed, thereby forming a first interlayer dielectric layer 135.

Figure 27:
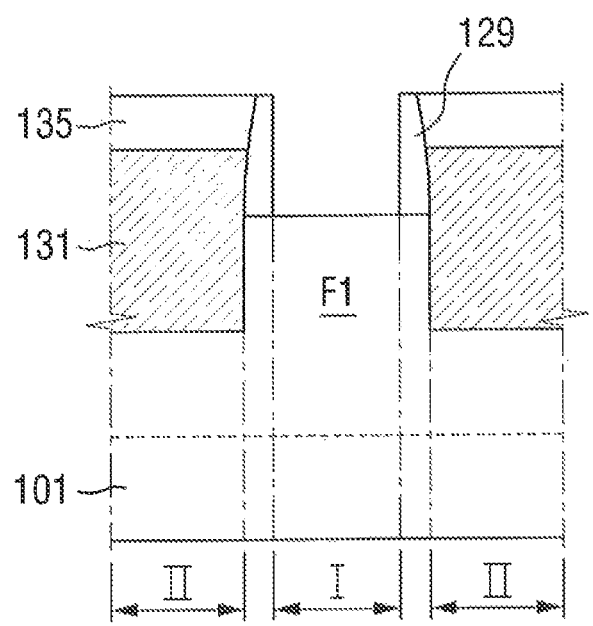
Figure 28:
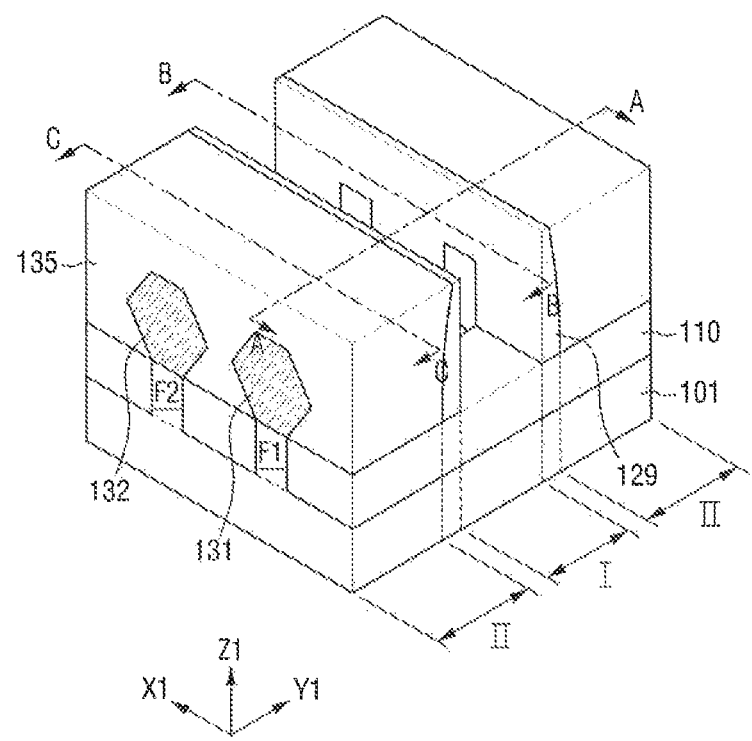
Figure 29:
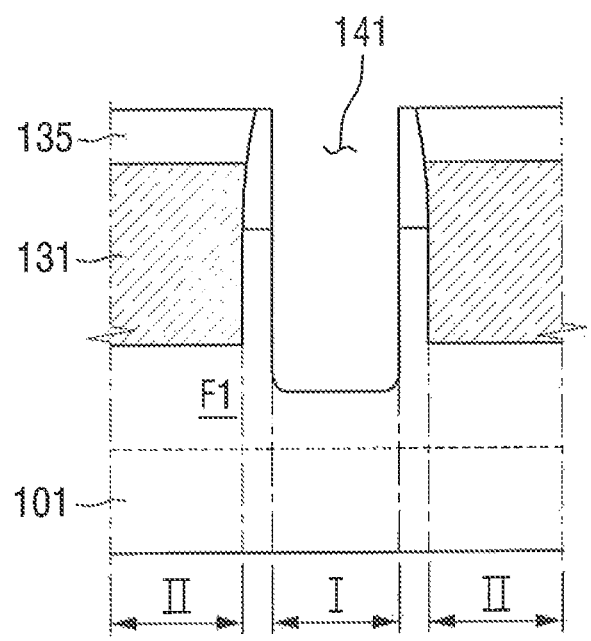
FIG. 29 is a cross-sectional view taken along line A-A of FIG. 28.

Referring to FIGS. 26 and 27, the dummy gate insulation layer 121 and the dummy gate electrode 123 are removed from the resulting structure of FIG. 25. If the dummy gate insulation layer 121 and the dummy gate electrode 123 are removed, the first regions I of the first and second fins F1 and F2 are exposed, and the isolation layer 110 disposed between the first regions I of the first and second fins F1 and F2 are exposed.

Referring to FIGS. 28 to 31, the first region I of each of the first and second fins F1 and F2 is etched to form the recess 141.

The recess 141 is formed, using the first interlayer dielectric layer 135 as a mask. The first region I includes a material having etch selectivity against the first interlayer dielectric layer 135, the isolation layer 110 and the spacer 129, and thus the first region I is etched to form the recess 141. For example, the first region I may include Si, and the first interlayer dielectric layer 135, the isolation layer 110 and the spacer 129 may include at least one of a silicon oxide layer, a silicon nitride layer, and a silicon oxynitride layer.

The recess 141 is formed using an isotropic etching process. The isotropic etching process allows the first region I to be etched in many directions, so that the first region I is entirely etched. In addition, angled portions of the first region I, for example, portions where the sidewalls and the top surface of the first region I meet, are becoming round since the etching is performed from the second direction Y1 and the third direction Z1. Therefore, the top surface 161 of the first region I is round and there are angled portions on the top surface 161 and the sidewalls 162 of the first region I. Since the isotropic etching process allows the sidewalls of the first region I to be etched as well, a width W1 of the first region I in the second direction X1 is smaller than a width W2 of the second region II in the second direction X1. In addition, the top surface 161 of the first region I is lower than the top surface of the second region II. For example, the top surface 161 of the first region I is lower than a bottom surface 131a of the sources/drains 131 and 132. Since the isolation layer 110 is not etched, a height h2 of the isolation layer 110 of the substrate 101 may be greater than a height h1 of the first region I.

Figure 30:
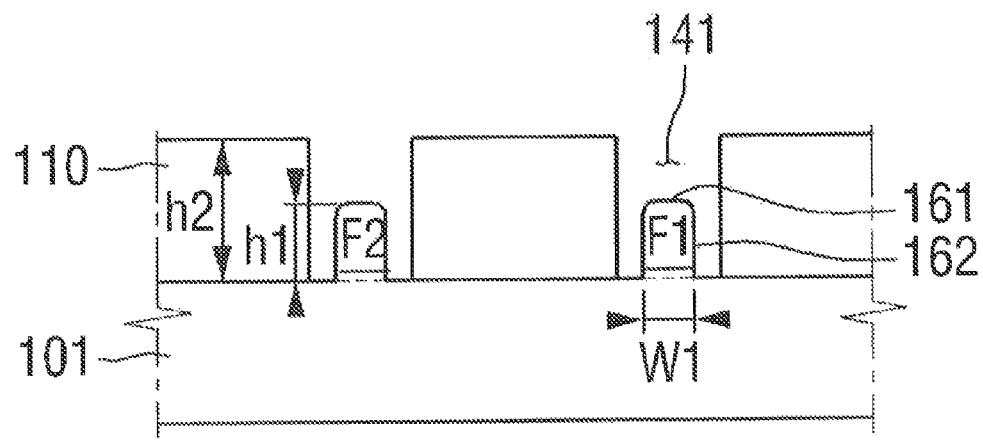
FIG. 30 is a cross-section view taken along line B-B of FIG. 28.
Figure 31:
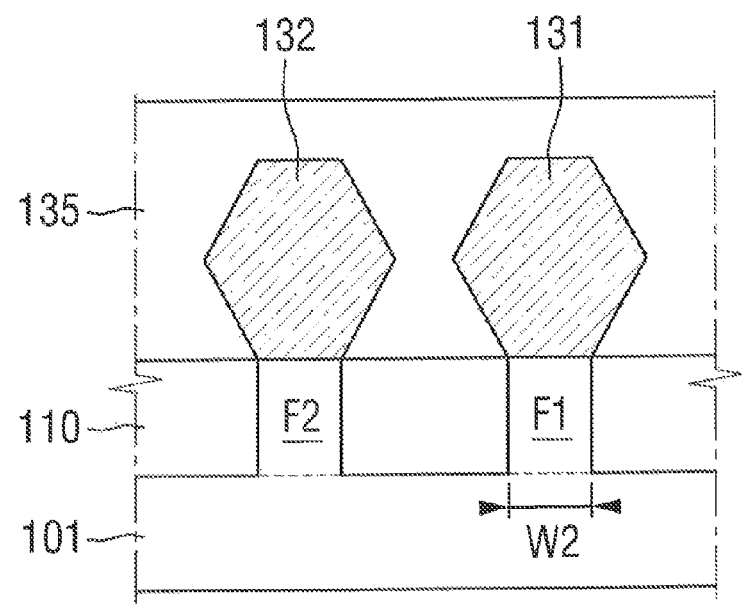
FIG. 31 is a cross-sectional view taken along line C-C of FIG. 28.

Referring to FIG. 30, the first and second fins F1 and F2 are arched, since the top surface 161 of the first and second fins F1 and F2 is curved. In addition, the sidewalls 162 of the first and second fins F1 and F2 are spaced apart from the sidewalls of the isolation layer 110.

Referring to FIGS. 1 to 4, the gate structure 151 is formed in the first region I to fill the recess 141. The gate insulation layer 153 and the first metal layer MG1 are conformally formed along the top surface 161 and the sidewalls 162 of the first region I, and the second metal layer MG2 is formed on the first metal layer MG1 to fill the recess 141.

The gate structure 151 is formed in the recess 141 in the first region. The first region I and the second region II are spaced apart from each other using the spacer 129.

The gate insulation layer 153 may include a high-k material having a higher dielectric constant than a silicon oxide film. For example, the gate insulation layer 153 may include $HfO_2$, $ZrO_2$, or $Ta_2O_5$. The gate insulation layer 153 is conformally formed along the sidewalls and bottom surface of the recess 141.

The gate electrode 155 includes metal layers MG1 and MG2. The first metal layer MG1 is stacked on the second metal layer MG2. The first metal layer MG1 may control a work function, and the second metal layer MG2 may fill a space formed using the first metal layer MG1. For example, the first metal layer MG1 may include at least one of TiN, TaN, TiC, and TaC. In addition, the second metal layer MG2 may include W or Al. Further, the gate electrode 155 may be made of Si or SiGe, instead of a metal.

While the present inventive concept has been shown and described with reference to exemplary embodiments thereof; it will be apparent to those of ordinary skill in the art that various changes in form and detail may be made therein without departing from the spirit and scope of the inventive concept as defined by the following claims.

What is claimed is:

1. A semiconductor device comprising:
   a substrate including a fin, wherein the fin extends in a first direction;
   a gate structure disposed on a first region of the fin, wherein the gate structure extends in a second direction crossing the first direction and includes a gate insulation layer and a gate electrode;
   a source/drain disposed on a second region of the fin, wherein the source/drain is disposed on at least one sidewall of the gate structure; and
   a spacer disposed on a third region of the fin and interposed between the source/drain and the gate structure,
   wherein the third region of the fin is vertically overlapped with spacer and interposed between the first region of the fin and the second region of the fin,
   wherein a top surface of the first region is lower than a top surface of the second region,
   wherein a top surface of the third region is higher than a top surface of the first region and a top surface of the second region, and
   wherein the gate insulation layer is disposed between the gate electrode and the spacer.

2. The semiconductor device of claim 1, wherein the top surface of the first region is convex.

3. The semiconductor device of claim 2, wherein the convex top surface of the first region is substantially smooth.

4. The semiconductor device of claim 1, wherein a width of the first region is smaller than that of the second region, wherein the widths are measured in the second direction.

5. The semiconductor device of claim 1, wherein the source/drain includes a diamond-shaped cross-section.

6. The semiconductor device of claim 1, further comprising an isolation layer disposed on the substrate, wherein the second region of the fin is in contact with the isolation layer and the first region of the fin is spaced apart from the isolation layer.

7. The semiconductor device of claim 6, wherein the top surface of the first region is lower than a top surface of the isolation layer.

8. The semiconductor device of claim 1, wherein the first region of the fin includes a channel region and the channel region is U-shaped.

* * * * *